United States Patent [19]

Kelly

[11] 4,023,368

[45] May 17, 1977

[54] HIGH DENSITY-THIRD DIMENSION GEOMETRY SOLAR PANELS

[76] Inventor: Donald A. Kelly, 58 - 06 69th Place, Maspeth, N.Y. 11378

[22] Filed: Aug. 26, 1975

[21] Appl. No.: 607,918

[52] U.S. Cl. .................................. 60/698; 60/641; 136/89 P; 250/203 R; 250/238; 136/89 AC
[51] Int. Cl.² .................. F03G 7/02; H01L 31/00
[58] Field of Search ............. 126/270, 271; 136/89; 60/641, 698, 650, 682; 250/203, 238

[56] References Cited

UNITED STATES PATENTS

| | | | |
|---|---|---|---|
| 3,227,885 | 1/1966 | Hirai et al. | 250/238 |
| 3,427,200 | 2/1969 | Lapin et al. | 136/89 |
| 3,490,950 | 1/1970 | Myer | 136/89 |
| 3,802,920 | 4/1974 | Salles et al. | 136/89 |
| 3,863,870 | 2/1975 | Andrews et al. | 136/89 |

*Primary Examiner*—Allen M. Ostrager

[57] ABSTRACT

The high density, third dimension geometry solar panels consist of closely placing any type of conventional solar cells in an in depth, oblique attitude to the sun's normal rays.

In one panel arrangement, highly polished side reflectors are applied to reflect the sun's rays into the underside groups of solar cells so that a minimum of surface area is required for a higher than normal electrical power yield from the high density cells.

The most effective geometric shape for these reflected type of solar panels is the triform, or tri-panel, and modifications of the triform cross-section.

Another type of high density solar panel is the V form, or Vee cavity form in which the individual solar cells must have reflective surfaces, for mutual reflection and solar energy concentration.

10 Claims, 8 Drawing Figures

HIGH DENSITY-THIRD DIMENSION GEOMETRY SOLAR PANELS

BACKGROUND OF THE INVENTION

All of the current solar cell panel arrangements using conventional solar cells in continuous flat arrays depend on direct or normal exposure to solar radiant energy to produce their rated power outputs.

The present ground based solar electrical cells and panels utilizing silicon or other types of solar cells are intended for direct conversion of the sun's energy into D.C. electrical power, and currently their wide scale application is not economically practical because of excessive production costs, and generally poor cost/effectiveness ratios, Most of the present ground based solar panel arrangements that have been proposed and utilized make use of large tracts of open, flat lands, where the solar cell panels are arrayed in an orderly direction and attitude to make optimum use of the solar radiant energy.

While this method is logical and practical for economical direct solar electrical conversion in remote and rural areas of the conntry, it does not provide for the high density panel concentration required for urban areas, where electrical power is always in large demand, and sometimes in short supply.

At the present time there are four basic types of solar cells available and in use for various solar panel arrays, with further development effort proceeding to improve power output and efficiencies. The latest gallium-arsenide type of cell is in the development stage and showing considerable promise for high efficiencies at moderate costs.

The most widely used solar cells at this time are the silicon-type which produce moderate electrical outputs, but at excessively high costs per unit cell. Work is continuing to be done on silicon cell variations, specifically in improving production techniques to sharply lower the end cost of these cells. The cadmium-sulphide solar cells used in some solar panel systems are less efficient than equivalent silicon cells, but are correspondingly less expensive, so that they are still actively used in experimental solar conversion systems.

The least effective, and least used of the solar cells, is the low cost selemium cell, which will probably be dropped from further use as the other types of solar cells are evolved and improved.

The cost of all the various types of solar cells must be drastically reduced and/or conversion efficiencies raised significantly before these solar cells can be incorporated into cost/effective solar conversion system for urban applications.

Some types of solar cells utilize small, multiple magnifier lenses which are molded into the transparent plastic housings to increase solar concentration and corresponding power output. While this construction boosts the power output slightly, the increase is generally insignificant.

The use of reflective sunlight concentrators is a way to increase power output and lower costs, but there are limitations to utilizing this method because of available surface space and heat buildup. Parabolic reflectors and plastic Fresnel lenses may be used to concentrate sunlight onto the centers of each solar cell, provided that adequate heat dissipation means are applied to the conversion arrangement.

Another problem which must be faced and resolved economically is the necessity for movable or sun-following solar panel arrays. The effectiveness of fixed solar panel arrays is seriously limited to receiving optimum solar energy during only a portion of one-days sunlight, while the moving, sun-following solar panels can receive the ideal normal solar radiation over approximately ten hours or 150 degrees of angular travel, under ideal exposure conditions.

The sun following solar panels may be actuated by a pendulum weight drive arrangement, with manual resetting at the end of each day, or by a fully automatic drive may be selected which uses a small percentage of the D.C. electrical power generated by the solar panel array.

This present high density, -third dimension geometry solar panel concept is advocated as a means of utilizing the lower cost, -less efficient solar cells, such as CdS cells, and some types of silicon cells into dense panel arrays which require substantially less solar exposure surface area per unit cell area, by setting the cells indepth, at oblique angles to normal solar radiation exposure.

In a previously advocated high density solar panel arrangement, multiple closely spaced solar cells were mounted on both faces of a flat, elongate solar panel. A pair of side reflectors directed the sun's rays onto the underside, unexposed solar cells. This refelection method onto flat solar panels is not as effective as the presently advocated tri-panel reflective design, where the underside solar cells are doubled in number, in two rows, and the reflectors set parallel to each row of solar cells for normal solar exposure between the solar cells and the reflectors.

Modifications of the basic tri-form solar panel are possible such as a diamond or squarish cross-section, with four rows of solar cells, but these shapes will result in about the same output-effectiveness as the basic tri-form shaped panels.

The multiple solar tri-panels and other types of high density panels are intended for mounting on flat, nearly level roofs of various urban buildings for optimum exposure to solar radiation.

SUMMARY OF THE INVENTION

The high density, third dimension geometry solar panels have been evolved from the necessity of significantly reducing the cost of solar energy conversion systems, which at the present time are prohibitively high and out of reach of wide scale practical applications.

The concept is based on utilizing the lower cost, moderately efficient commercial solar cells now available such as some types of of silicon cells and cadmium sulphite (CdS) cells in closely packed third dimensional panel arrays to conserve the area/space required for each specific installation.

One form of high density geometric arrangement consists of using a tri-panel design, or triangular cross-section shape, with multiple solar cells closely spaced along each of the three faces of the tri-panel. The tri-form panels would be set with one upper face normally exposed to solar energy, and the two lower, equally unexposed faces receiving the sun's rays by way of two side, slightly convexed reflectors.

The two side reflectors are set parallel to the two lower triform faces so that the solar radiation is uniformly transferred normally from the highly polished reflector surfaces onto the solar cell faces. This arrangement would minimize light transfer losses, while providing a significantly reduced area solar radiation entrance zone to the underside rows of solar cells, which is the purpose of the high density solar panel concept.

The width of the side entrance zone must be about one-half the width of the solar cells used so that a tri-panel width reduction of about 33% is achieved. This would mean that each tri-form panel section would nearly produce the electrical power output of three rows of solar cells in the space normally occupied by two rows of the same solar cells.

While this space reduction feature would have little value for solar panel arrays located in rural and/or remote land areas, it will have considerable significance to urban solar systems, where building space has a very high value and the electrical power produced is always needed.

Because of the reduced area, side solar ray entrance zone, the two side reflectors must be slightly convexed toward the solar-cell rows in order to cause a slightly solar ray divergence, so that the full width of the underside solar cells are exposed to the reflected sunlight.

The slight ray divergence will cause a slight loss of electrical output from the normal level of the cells, but this would be more than offset by the substantial space reduction feature, as previously described.

Each side reflector must be made of a highly polished, bright-metal and secured to the tri-form panel section by equally spaced thin metal fins. The reflectors must be accurately convexed to match the focal pattern of the tri-form panel and mounted solar cells and rigidly held in position on the tri-form shell.

A central duct will be formed by the tri-form shell, which can be used to dissipate the excessive heat generated at the solar cell rows. A cooling air flow may be provided at one end of all the tripanels to produce a cross air flow through the central ducts of all the tripanels in the array system. It is important that the solar cells be kept from becoming excessively hot, since they tend to loose efficiency at excessively high temperatures.

Each of the tri-form panels is fitted with central end pivots which are held in place within sockets in an open framework which supports the entire solar tri-form panel array. The open framework is supported by multiple, vetical support posts, which are secured to the rooftop or parapets of generally flat urban buildings.

Although not prominent as a feature of this solar conversion system, any type of vertical wind turbine such as the Darrieus or Savonius units, may be incorporated into this solar panel arrangement.

This generally rectangular, flat solar panel array located on flat elevated open framework lends itself to the inclusion of multiple, vertical wind turbines revolving directly on the vertical support posts of the solar panel open framework.

Another type of high density, third dimension geometry solar panel is the V cavity form arrangement, which features central reflective surfaces and mutual reflection solar saturation. One V form cavity design is the box-form or honeycomb array, where four angled, nearly vertical squarish surfaces are joined to form a box-like structure.

Multiple solar cells -(four) are mounted on each of the four nearly vertical surfaces with a central reflective parabolic pyramid reflecting solar energy onto each of the four solar cell surfaces.

It is important that the central reflective modified pyramid have approximate parabolic surfaces in order to effectively reflect solar rays onto the solar cells uniformly.

The box-form of four solar cells are connected together with identical units to form a full panel array similar to the tri-panel arrays.

In this box-form design the sun's rays are obliquely reflected onto each of the solar cells by the modified parabolic pyramid-reflectors, one for each cell, and while some light transfer losses occur due to oblique solar ray impingement, these losses are offset by the concentration of four solar cells placed in the space- (surface area) normally occupied by one similar solar cell in a flat array pattern.

While this described box-form design features the use of four solar cells set in a single cell height attitude, it is possible, and highly desirable to arrange the cells in more than one cell height, and up to as many as four or five cells in height, as a practical height limitation.

Multiple height cells provide for a dense concentration of solar cells when set in a V form, as described.

A variation of the box-form cavity design is the continuous V linear form, in which multiple height solar cells are set on both faces of the V surfaces. A mutual reflective pattern is established between the opposite sets of solar cells, in addition to oblique solar radiation received by each of the angled solar cells.

This V form arrangement will require that the solar cell faces be flat and smooth to reflect a portion of the solar rays onto the opposite solar cell faces.

The opposite V surfaces must be set at an angle of 45° (included angle), in order to insure proper mutual reflection between the opposite corresponding cells. The included angle between the solar cell mounting surfaces should not exceed ninety (90*) degrees, since this will result in the use of an excessively high and unadvantageous surface area, compared to the effective power output from the solar cell array.

V reflective surfaces set at an included obtuse angle would not be satisfactory, since the solar rays are not effectively reflected.

The success of the mutual reflection concept will depend on the degree of reflectivity of the transparent solar cell top faces.

A further variation of the box-form cavity arrangement would be a double V form, with sets of solar cells secured to the outer sloped V surfaces only, with the inner portions of the V's used as reflecting surfaces. This form is essentially the first box-form in a linear arrangement, with less loss incurred from the reflective central modified pyramids.

In this arrangement the inner V portions would have a parabolic shape to insure uniform solar radiation transfer to all of the solar cells on the outer sloped surfaces.

The multiple horizontal high density solar panels have the general appearance of jalousie windows set horizontally, since the panels or slats are of uniform size and shape, and rotate in a generally similar manner to the slatted type of windows and doors.

The main difference in operation between these multiple solar panels is that they must fully rotate past each other without touching, with tiny gaps between them, unlike the various jalousie units.

The high density solar panel arrays must always be arranged closely in line with an east-west direction so that the solar panels and mounted cells will follow the sun's direct, normal rays during a full day's sunlight. The panels will oscillate together over 150° from an easterly direction in the morning and uniformly rotated toward the west in the afternoon. Compensation must be made for the latitude of the installation so that the panel array is slanted toward the average solar excursion relative to the specific site.

The ends of each high density solar panel are fitted with a crank arm, which in turn, is connected to a horizontal cross-link, which controls the angular position of all the solar panels simultaneously. The end of the horizontal cross-link is connected to a drive arm and timing disc, so that as the timing disc is revolved the panels are slowly rotated.

The timing disc may be revolved automatically by a D.C. drive motor and gear reduction unit, or manually by a gravity weight arrangement controlled by an escapement unit. The manual drive method will require that the timing disc and weight actuator be reset at the end of each day, and is therefore less convenient than a fully automatic panel oscillating drive means.

Each of the high density solar panels is pivotally mounted in the open framework which carries the entire solar panel array assembly. Four or more vertical support posts carry the open framework and attached solar panels above the flat roof surface, which may be set at any convenient height above the roof top surface.

An additional advantage to this flat, horizontal solar panel array and framework assembly is that during the hot summer days, the solar panels provide a full area shade for the roof surface, and therefore a cooler roof surface temperature for house cooling efficiency.

This shading feature is also attractive when the solar panels are used at ground level for shading walkways, garden shelters, pools, and similar property facilities.

The solar panel open framework and posts/structure must have efficient section modulii, and resist the affects of all types of imposed environmental loads, including sudden and unusual loads to which a rooftop structure may be subjected to.

For most installations the full solar panel array with vertical posts should never exceed a height of about eight feet, for rooftop applications, but may possibly be increased for ground level-structures, as required.

Because of this height limitation based on structural safety and servicability, the vertical wind turbines for these installations would be limited to about 5 feet in height, and about three or 4 feet in diameter.

Approximately two feet must be allowed for the housing of the drive generator at the base of the wind turbine, and the necessity of clearing rooftop parapets and walls.

A clearance height of about one foot must be allowed at the top of the solar panel assembly for the lateral panel crankarms and horizontal cross link, to clear the tops of the vertical wind turbines.

The inclusion of vertical wind turbines is viewed as practical for rooftop installations only, and not for any ground level application where people might be exposed to the whirling turbine rotors or blades of the vertical wind units.

It is a principal object of the invention to create high density, third dimension geometry solar panels which substantially reduce the solar surface exposure area for solar panel arrays, and thereby greatly increase the electrical power yield per square foot of solar panel area.

It is a further object of the invention to practically combine both solar and wind energy conversion means into one compatible and cost/effective alternate natural energy system.

Other specific objectives of the invention have been previously described in the background and summary portions of the specifications. It should be understood that changes and variations may be made in the detail design of the high density, third dimension, geometry solar panels, without departing from the spirit and scope of the invention as specified.

Several Disclosure Documents have been filed with the Office, which previously describe portions of the high density, third dimension geometry solar panels.

Disclosure Documents:
1. No. 042,263 — High Density Solar Cell and Panel Array
2. No. 042,494 — High Density Geometry Solar Panels
3. No. 042,850 — High Density, Reflective Solar Cell Sections.
4. No. 032,540 — Wind Rotor on Vertical Axis with Mask-Hood.

DESCRIPTION OF THE INVENTION

Figure 1:
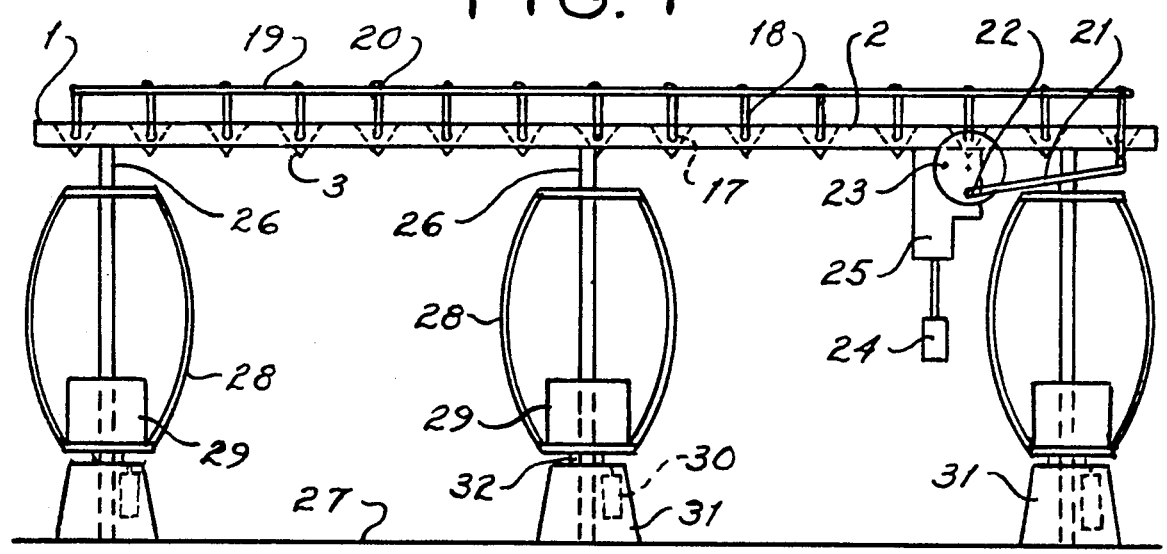
FIG. 1 is a side elevation view of the high density, third dimension geometry solar panels assembly and installation.
Figure 2:
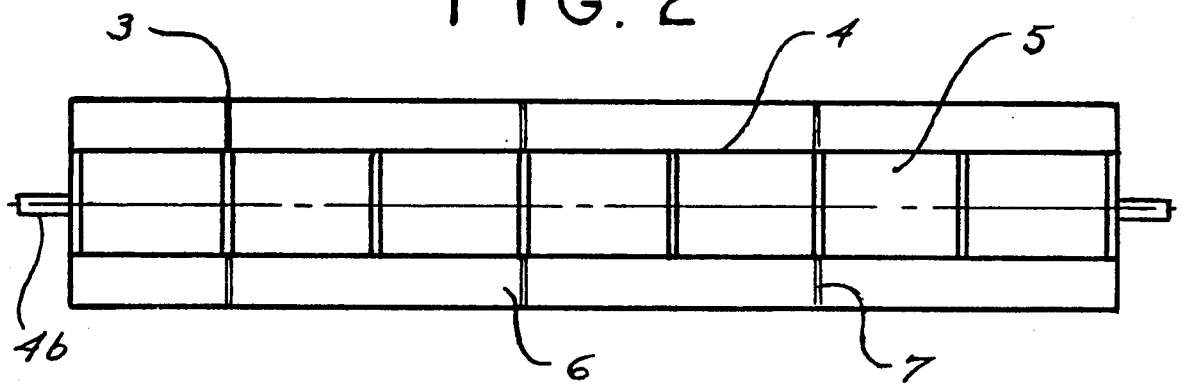
FIG. 2 is a plan view of one high density solar panel with solar cells.
Figure 3:
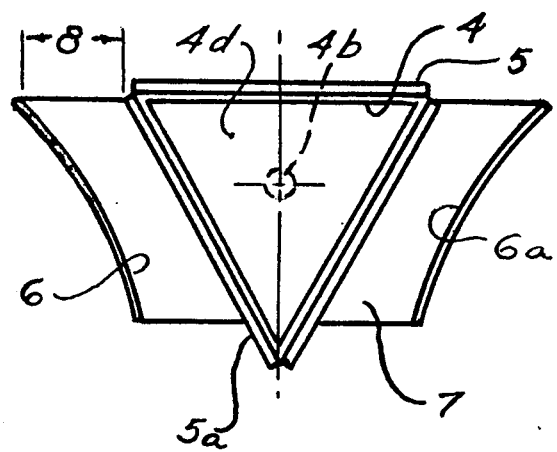
FIG. 3 is an elevation/section view through a tri-form solar panel.
Figure 4:
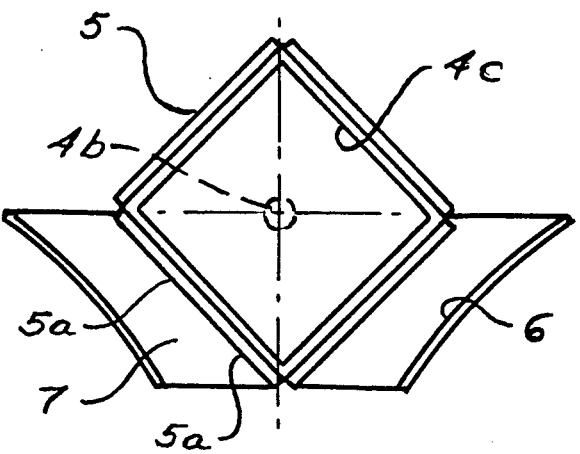
FIG. 4 is an elevation/section view through an alternate quad-form (squarish) solar panel.
Figure 5:
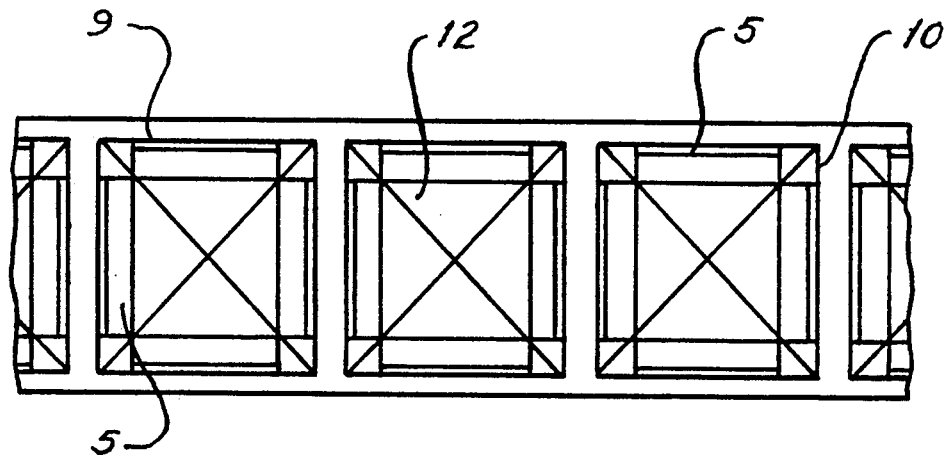
FIG. 5 is a plan view of a high density box form cavity with four oblique solar cells in place.
Figure 6:
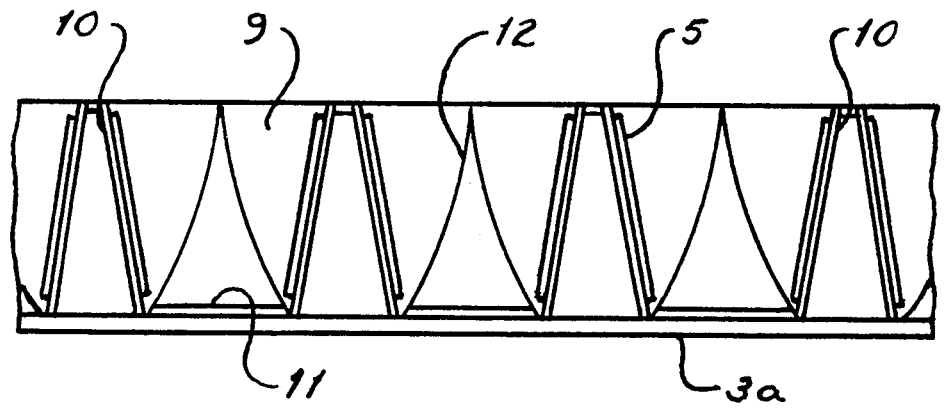
FIG. 6 is an elevation/section view through a high density box-form cavity with four oblique solar cells in place.
Figure 7:
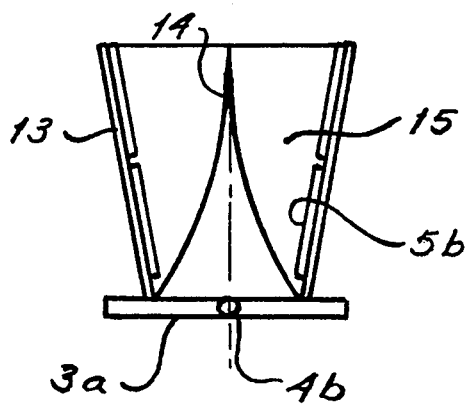
FIG. 7 is an elevation/section view through a high density continuous V linear form solar panel.
Figure 8:
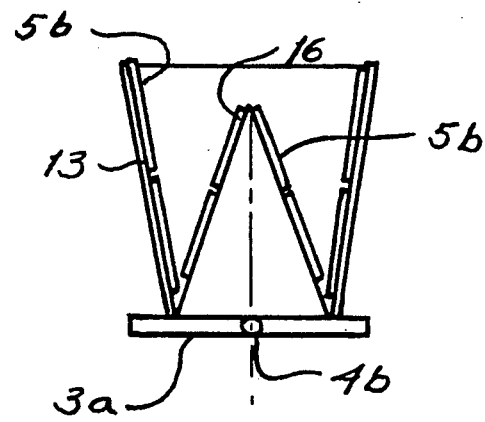
FIG. 8 is an elevation/section view through a high density continuous V linear form with mutual reflectivity solar cells.

The high density, third dimension geometry solar panels consists of the complete assembly and installation 1, which is comprised of an open framework structure 2, which supports all of the identical high density solar panels 3, in a compact, rotatable array.

One type of high density elongate solar panel 3, is in the form of a tri-face panel and tri-form shell 4, with three continuous flat elongate surfaces of triangular cross-section.

Multiple solar cells 5, are closely spaced and secured to the three surfaces of the tri-form shell 4.

Two identical elongate, convexed reflectors 6, are mounted to both sides of the tri-form shell 4, by means of multiple thin metal fins 7, uniformly spaced along the full length of the tri-form shell 4. A cooling duct 4d, is formed by the tri-form shell 4.

Two identical side solar radiation entrance zones 8, which are about one-half the width of the multiple solar cells 5, are formed between the tri-form shell 4, and the two identical convexed reflectors 6. The two identical side reflectors 6, are convexed 6a, toward the two rows of underside solar cells 5a, so that the solar radiation falls on the full width of each solar cell 5a, within the two underside rows.

The tri-form shell 4, is provided with end tabs 4a, which support the centrally positioned pivots 4b, at the extreme ends of the solar panels 3.

An alternate form of the high density elongate solar panel 3, consists of a quad-form or four-faced shell 4c, which is positioned in a similar manner to the tri-form shell 4. The four surfaces of the quad-form shell 4c, support closely spaced solar cells 5.

The same two, identical side reflectors 6, and mounting arrangement for them are provided for this alternate quad-form shell 4c.

A second type of high density, third dimension geometry solar panel 3, is the box-form cavity 9, which are provided with multiple oblique solar cells 5.

The box-form cavity 9, is comprised of four nearly vertical squarish, sheet metal sections 10, joined together as a box-like shell. A square, bottom sheet 11, joins all of the four squarish sheet metal sections 10.

A central parabolic-pyramid shaped quad-reflector 12, is fitted and secured at the bottom of the box-form cavity 9. The quad-reflector reflects the solar radiation onto the four solar cells 5, secured to each of the interior of the four squarish, sheet metal sections 10.

Multiple box-form cavity units 9, are uniformly joined together to form a full solar panel 3, which are held in place by means of the base panel 3a.

An alternate form of box-form cavity is similar in cross-section shape, but is in linear form wth two sloped, flat, elongate surfaces 13, supporting the multiple solar cells 5, which may be set in multiple height rows.

The central parabolic-pyramid reflector 14, also has the same cross-section shape as the corresponding box-form cavity reflectors, but is in linear form with a matching length identical to the sloped flat, elongate surfaces 13.

The two elements of this linear cavity form 13, and 14, are held together by divider plates 15, which may subdivide the linear cavity into convenient lengths for placement on the base panel 3a, to form the solar panels 3.

A further variation of this linear cavity form is the mutual reflectivity arrangement between opposite rows of multiple solar cells. The mutual reflectivity concept depends on utilizing solar cells 5b, with smooth transparent faces so that a portion of the radiant energy is reflected across to the opposite rows of solar cells 5b.

This linear cavity form would utilize the same sloped, flat, elongate surfaces 13, of the previous alternate form, but would require a flat, triangular central section 16, to support the central rows of multiple solar cells 5b.

The steep slopes of all these surfaces 13 and 16, must all be the same to maintain a minimum of surface exposure area at the top of the cavity form.

As in the case of the box-form cavity, the multiple solar cells, 5b, may be arranged in multiple height rows, with a minimum of one solar cell row height and a maximum of about five solar cell row heights.

The panel end pivots 4b, on each solar panel 3, are held in pivotal position within the open framework structure 2, by multiple pillow blocks 17, which are uniformly located along the sides of the open framework structure 2, with standard mounting hardware.

The end pivots 4b, are fitted with crankarms 18, which are locked in place on the end pivots 4b, with conventional fastening means.

A horizontal cross link 19, is pivoted to each crankarm 18, by means of crankpins 20.

One end of the horizontal cross-link 19, is connected to a crank 21, which is pivoted on the crankpin 22, secured to the timing disc 23.

The timing disc 23, is rotated by a pendulum drive 24, and controlled by the escapement mechanism 25.

The open framework structure 2, is supported by four or more round support posts 26, which are securely fastened to the rooftop top surface or parapets 27.

Vertical wind turbine units 28, of the Darrieus, non-directional type would be mounted on each of the support posts 26, with the addition of smaller Savonius starter rotors 29, directly above the base of the Darrieus wind turbine units 28.

The base of the Darrieus wind turbines 28, would drive D.C. generators 30, located within each of the base housings 31, through a suitable gear drive arrangement 32. No D.C. electrical output conductors as shown from any of the solar cells 5, and the D.C. generators for the sake of drawing clarity, and since these are conventionally combined into voltage and amperage ratings, as required by the specific installation.

What is claimed is:

1. High density third dimension geometry solar panels comprised of multiple elongate triangular cross-section panels containing multiple squarish solar cells on all three surfaces of said panels, dual identical elongate side reflectors disposed parallel to two lower sides of said multiple elongate triangular cross-section panels, multiple uniformly disposed supporting fins secured to said multiple elongate triangular cross-section panels and said dual identical elongate side reflectors, top edges of said dual identical elongate side reflectors positioned at a horizontal distance equal to nearly one-half the width of said multiple squarish solar cells, each of said multiple elongate triangular cross-section panels is pivotally mounted along their longitudinal geometric axes within a rectangular elevated open frame structure, multiple vertical support posts supporting said rectangular elevated open frame structure, the lower ends of said multiple vertical support posts are mounted on flat level rooftop surfaces, a crankarm secured at one end of each of said multiple elongate triangular cross-section panels, a cross link pivotally mounted and secured to the lower end of each said crankarm, connection at the end of said cross link to a crankarm pivotally mounted and secured to a timing disc, a pendulum drive and connection means revolving said timing disc, an escapement mechanism controlling the revolution rate of said timing disc, multiple vertical wind turbines centrally disposed on each of said multiple vertical support posts, drive transmission means from the base of said multiple vertical wind turbines rotatably connected to multiple D.C. generators disposed within protective housings secured to rooftop surfaces.

2. High density third dimension geometry solar panels, according to claim 1, in which said multiple elongate triangular cross-section panels pivot on their longitudinal geometric axes for a total of seventy-five degrees on either side of a vertical axis, said timing disc causes one complete oscillation of said multiple elongate triangular cross-section panels over a period of 24 hours, shaft and journal means for said timing disc, mounting means for said shaft and journal, locking means for said crankarm secured at one end of each of said multiple elongate triangular cross-section panels, locking means for said cross link pivotally mounted and secured to the lower end of each said crankarm, manual resetting means for said gravity weight and connection means revolving said timing disc, hollow builtup sheet metal construction of said multiple elongate triangular cross-section panels, air circulation passage means through the center of said multiple elongate triangular cross-section panels.

3. High density third dimension geometry solar panels, according to claim 1, in which said dual identical elongate side reflectors disposed parallel to two lower sides of said multiple elongate triangular cross-section panels are slightly convexed toward the longitudinal geometric axis of said multiple elongate triangular cross-section panels, a minimized optimum lateral solar ray entrance gap for said dual identical elongate side reflectors, each of said dual identical elongate side reflectors are constructed of smooth highly polished bright thin sheet metal, multiple rivet or screw securing means for joining said dual identical elongate side reflectors to said multiple uniformly disposed supporting fins, multiple machine screw and locking means for joining and locking said multiple uniformly disposed supporting fins to said multiple elongate triangular cross-section panels, 4. High density third dimension geometry solar panels, according to claim 1, in which said multiple elongate triangular cross-section panels are alternately constructed as square cross-section panels, identical axial attitude of square cross-sectioned panels with said multiple elongate triangular cross-section panels, dual identical elongate side reflectors disposed parallel to two lower sides of said multiple elongate panels, multiple uniformly disposed supporting fins secured to said dual identical elongate side reflectors and said multiple elongate panels, multiple squarish solar cells closely spaced on all four surfaces of said multiple elongate panels, top edges of said dual identical elongate side reflectors positioned at a horizontal distance equal to nearly one-half the width of said multiple squarish solar cells, each of said multiple elongate panels is pivotally mounted along their longitudinal geometric axes within a rectangular elevated open frame structure, multiple vertical support posts supporting said rectangular elevated open frame structure.

5. High density third dimension geometry solar panels, according to claim 1, in which said multiple vertical wind turbines centrally disposed on each of said multiple vertical support posts revolve on low friction ball bearings, said multiple vertical wind turbines are of the Darrieus non-directional type fitted with Savonius starting rotors at the base of said turbines, said drive connection means partially consists of a spur gear and pinion set, the height of said multiple wind turbines must not exceed approximately three-quarters the height of said multiple vertical support posts, the width of said multiple vertical wind turbines must not exceed one-half the height of said multiple vertical support posts, access means to said multiple D.C. generators within said protective housings.

6. High density third dimension geometry solar panels comprised of multiple square box-like cavities consisting of four steep-slope flat surfaces joined together in a square pattern, a square bottom sheet joins all of said four steep-slope flat surfaces at their bottom edges, a central parabolic four-sided pyramid reflector is disposed and secured to said square bottom sheet, a highly polished reflective surface for each of the four sides of said central parabolic four-sided pyramid reflector, multiple squarish solar cells in multiple rows mounted on all four steep-slope flat surfaces, joining and securing of multiple square box-like cavities together as identical units on multiple flat elongate base panels, each of said flat elongate base panels is pivotally mounted along their longitudinal centerline within a rectangular elevated open frame structure, multiple vertical support posts supporting said rectangular elevated open frame structure, the lower ends of said multiple vertical support posts are mounted to flat level rooftop surfaces, a crank arm secured at one end of each of said multiple flat elongate base panels, a cross link pivotally mounted and secured to the lower end of each of said crankarms, connection of the end of said cross link to a crankarm pivotally mounted and secured to a timing disc, a pendulum-drive-and connection means for revolving said timing disc, an escapement mechanism controlling the revolution rate of said timing disc, multiple vertical wind turbines rotatably disposed on each of said multiple vertical support posts, drive transmission means from the base of said multiple vertical wind turbines rotatably connected to multiple D.C. generators disposed within protective housings secured to rooftop surfaces.

7. High density third dimension geometry solar panels according to claim 6, in which said multiple square box-like cavities are alternately constructed in a linear continuous surface form, two elongate steep-slope flat surfaces comprising a box-like cavity formed together with a flat elongate bottom surface, a central parabolic pyramid reflector in linear form disposed and secured to said flat elongate bottom surface, multiple squarish solar cells mounted in multiple rows on said two elongate steep-slope flat surfaces, securing of said box-like cavities in a linear continuous surface form to multiple flat elongate base panels, each of said multiple flat elongate base panels is pivotally mounted along their longitudinal centerline within a rectangular elevated open frame structure.

8. High density third dimension geometry solar panels according to claim 6, in which said multiple square box-like cavities are alternately constructed in a linear continuous surface form, four elongate steep-slope flat surfaces comprising a modified box-like cavity formed together with a flat elongate bottom surface, multiple squarish solar cells mounted in multiple rows on said four elongate steep-slope flat surfaces, said multiple squarish solar cells provided with smooth flat transparent reflective surfaces, securing of said box-like cavities in a linear continuous surface form to multiple flat elongate base panels, each of said multiple flat elongate base panels is pivotally mounted along their longitudinal centerline within a rectangular elevated open frame structure.

9. High density third dimension geometry solar panels according to claim 6, in which said steep-slope flat surfaces are between sixty degrees and seventy degrees from a vertical axis, said central parabolic four-sided pyramid reflector may be molded from a solid material, said steep-slope flat surfaces joined togeter in a square pattern and said square bottom sheet are formed from one sheetmetal pattern.

10. High density third dimension geometry solar panels according to claim 6, in which said multiple squarish solar cells are of the moderate efficiency-low cost type, any type of minimum cost cadmium-sulphide, silicon, or gallium-arsenide solar cell is applicable.

* * * * *